United States Patent
Luo (10) Patent No.: US 9,484,328 B2
(45) Date of Patent: Nov. 1, 2016

(54) BACKSIDE THROUGH SILICON VIAS AND MICRO-CHANNELS IN THREE DIMENSIONAL INTEGRATION

(71) Applicant: Empire Technology Development LLC, Wilmington, DE (US)

(72) Inventor: Zhijiong Luo, Poughkeepsie, NY (US)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 0 days.

(21) Appl. No.: 14/450,203

(22) Filed: Aug. 1, 2014

(65) Prior Publication Data

US 2016/0035704 A1  Feb. 4, 2016

(51) Int. Cl.
| | | |
|---|---|---|
| *H01L 23/52* | (2006.01) | |
| *H01L 25/065* | (2006.01) | |
| *H01L 25/00* | (2006.01) | |
| *H01L 21/768* | (2006.01) | |
| *H01L 21/3065* | (2006.01) | |
| *H01L 23/367* | (2006.01) | |
| *H01L 23/532* | (2006.01) | |

(52) U.S. Cl.
CPC ....... *H01L 25/0657* (2013.01); *H01L 21/3065* (2013.01); *H01L 21/76898* (2013.01); *H01L 23/367* (2013.01); *H01L 25/50* (2013.01); *H01L 23/53214* (2013.01); *H01L 23/53228* (2013.01); *H01L 23/53257* (2013.01); *H01L 2225/06541* (2013.01); *H01L 2225/06548* (2013.01)

(58) Field of Classification Search
CPC ............. H01L 25/0657; H01L 23/481; H01L 21/76898; H01L 21/3065; H01L 21/28568
USPC ........................................................ 257/774
See application file for complete search history.

(56) References Cited

U.S. PATENT DOCUMENTS

| | | | |
|---|---|---|---|
| 6,448,661 B1* | 9/2002 | Kim .................. H01L 23/481 257/686 |
| 7,432,592 B2 | 10/2008 | Shi et al. | |
| 7,902,643 B2* | 3/2011 | Tuttle ............... H01L 21/76898 257/659 |
| 8,138,029 B2* | 3/2012 | Zhu .................... H01L 21/8221 438/149 |
| 8,198,174 B2* | 6/2012 | Hsu .................. H01L 21/76898 257/E21.585 |
| 8,288,243 B2 | 10/2012 | Jacobsen et al. | |
| 8,426,961 B2* | 4/2013 | Shih ..................... H01L 21/486 257/698 |
| 8,748,288 B2* | 6/2014 | Farooq .................. B32B 15/20 257/686 |
| 9,087,821 B2* | 7/2015 | Lin ..................... H01L 23/481 |
| 2009/0251862 A1 | 10/2009 | Knickerbocker et al. | |
| 2011/0168434 A1* | 7/2011 | Farooq ............... H01L 21/2007 174/257 |

OTHER PUBLICATIONS

Bakir, M. S., et al. "Electrical, Optical, and Thermofluidic Chip I/O Interconnections," ASME 2007 InterPACK Conference, vol. 1, pp. 11-17, ASME, Jul. 8-12, 2007.
Sunohara, M., et al., "Silicon Interposer with TSVs (Through Silicon Vias) and Fine Multilayer Wiring," Electronic Components and Technology Conference, pp. 847-852, IEEE (2008).

* cited by examiner

*Primary Examiner* — Luan C Thai
(74) *Attorney, Agent, or Firm* — Turk IP Law, LLC (57) ABSTRACT

Technologies are generally described related to electrical connectivity and heat mitigation in three dimensional integrated circuit (IC) integration through backside through silicon vias (TSVs) and micro-channels. In some examples, micro-channels may be formed in a wafer using a reactive ion etching (RIE) or similar fabrication process. Upon alignment and bonding of two wafers, selected micro-channels may be converted into TSVs by a further RIE or similar process and filled.

15 Claims, 6 Drawing Sheets

BACKSIDE THROUGH SILICON VIAS AND MICRO-CHANNELS IN THREE DIMENSIONAL INTEGRATION

BACKGROUND

Unless otherwise indicated herein, the materials described in this section are not prior art to the claims in this application and are not admitted to be prior art by inclusion in this section.

A three dimensional (3D) package may contain two or more integrated circuits (ICs) stacked vertically so that they occupy less space and/or have greater connectivity. In some implementations, a carrier substrate containing through silicon vias (TSVs) may be used to connect multiple ICs together in a package. In some 3D packages, the stacked ICs may be wired together along their edges slightly increasing the dimensions of the package and typically including an extra interposer layer between the ICs. The TSVs may replace edge wiring by creating vertical connections through the body of the ICs eliminating the added length or width due to edge wiring and the additional thickness (and fabrication steps) associated with the interposer layer. However, TSVs may complicate the fabrication process.

In addition, stacked ICs may be prone to heat related performance issues more so than individual ICs because heat accumulation due to multiple ICs operating in close proximity (attached to each other) may affect each of the ICs. Various approaches to enhance heat dissipation in stacked ICs may add yet more complexities to the fabrication process.

SUMMARY

The present disclosure generally describes electrical connectivity and heat mitigation in three dimensional IC integration through backside TSVs and micro-channels.

According to some examples, three-dimensionally integrated semiconductor devices may be described. An example three-dimensionally integrated semiconductor device may include a first wafer including a plurality of micro-channels within a substrate of the first wafer and one or more through silicon vias (TSVs) within the substrate and an insulating layer of the first wafer, and a second wafer, where the one or more TSVs are configured to contact the second wafer and at least a portion of the one or more TSVs is configured to overlap with corresponding micro-channels.

According to other examples, methods to fabricate a three-dimensionally integrated semiconductor device may be described. An example method may include forming a plurality of micro-channels within a substrate of a first wafer; positioning a second wafer over the first wafer such that an insulating layer of the second wafer is in contact with the substrate of the first wafer; and bonding the first wafer and the second wafer. The example method may also include forming one or more through silicon vias (TSVs) within the substrate and an insulating layer of the first wafer, where the one or more TSVs are configured to contact the second wafer and at least a portion of the one or more TSVs is configured to overlap with corresponding micro-channels.

According to further examples, a system configured to fabricate a three-dimensionally integrated semiconductor device may be described. An example system may include a removal module configured to form a plurality of micro-channels within a substrate of a first wafer, a placement module configured to position a second wafer over the first wafer such that an insulating layer of the second wafer is in contact with the substrate of the first wafer, and a bonding module configured to bond the first wafer and the second wafer. The system may also include a controller configured to coordinate operations of the removal module, the placement module, and the bonding module. The removal module may be further configured to form one or more through silicon vias (TSVs) within the substrate and an insulating layer of the first wafer such that the one or more TSVs are configured to contact the second wafer and at least a portion of the one or more TSVs is configured to overlap with corresponding micro-channels.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to electrical connectivity and heat mitigation in 3D IC integration through backside TSVs and micro-channels, as well as methods and techniques to fabricate such devices.

Briefly stated, technologies are generally described related to electrical connectivity and heat mitigation in three dimensional integrated circuit (IC) integration through backside through silicon vias (TSVs) and micro-channels. In some examples, micro-channels may be formed in a wafer using a reactive ion etching (RIE) or similar fabrication process. Upon alignment and bonding of two wafers, selected micro-channels may be converted into TSVs by a further RIE or similar process and filled.

Figure 1:
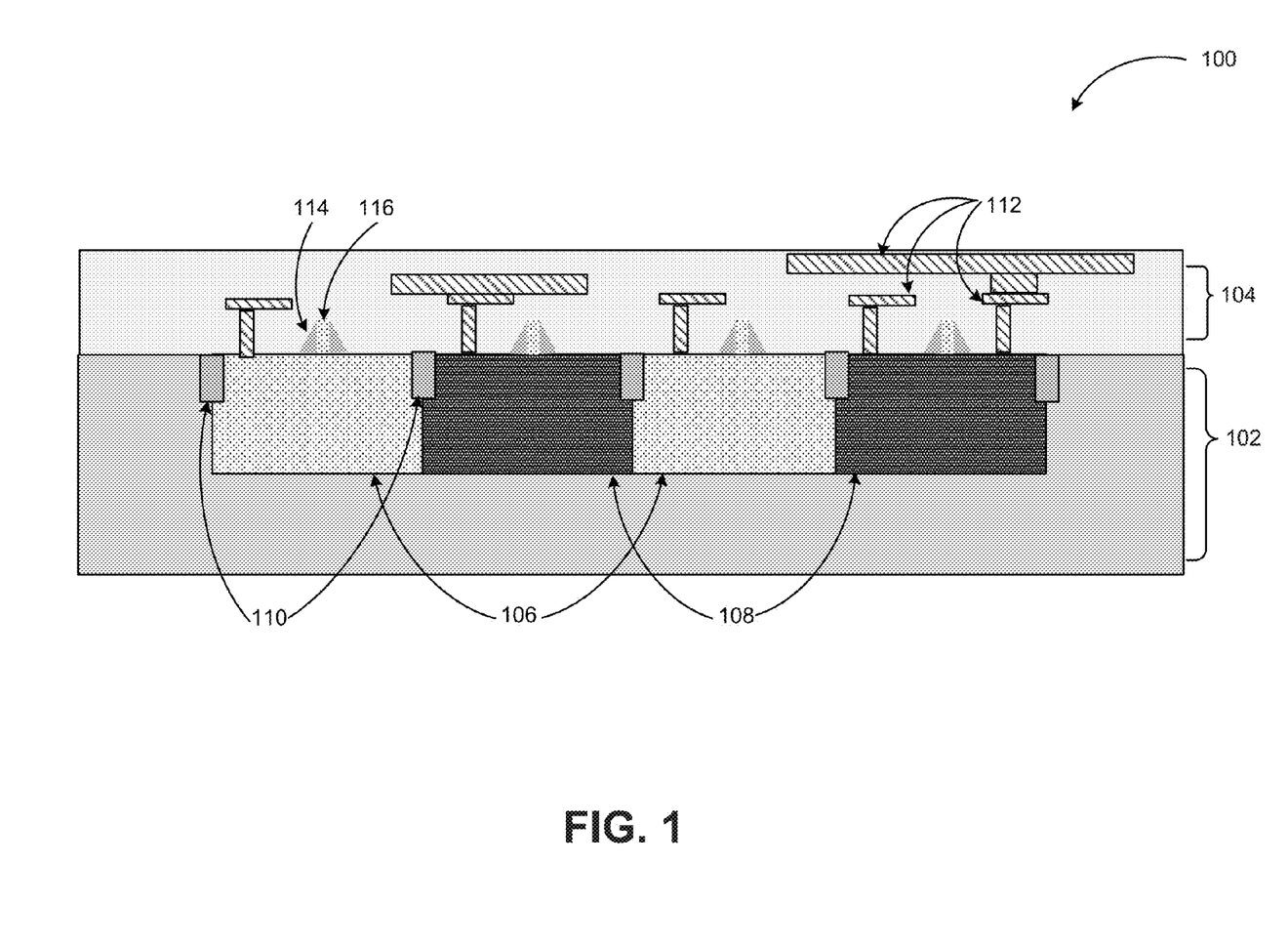
FIG. 1 illustrates an example planar wafer that includes multiple integrated circuits (ICs)

FIG. 1 illustrates an example planar wafer that includes multiple integrated circuits (ICs), arranged in accordance with at least some embodiments described herein.

Diagram 100 shows an example wafer with multiple semiconductor devices or integrated circuits. In examples a first wafer ma include a first integrated circuit and a second wafer ma include a second integrated circuit. The wafer may include a substrate 102 and an insulating layer 104 over the substrate 102. Various portions of the integrated circuits may be formed within the substrate through implantation with varying concentrations of dopants. For example, suitable dopants at selected concentrations may be deposited to form n-wells and p-wells 106, 108, Additional IC components may include shadow trench isolation (STI) regions 110, as well as components formed in the insulating layer 104 as extensions of the substrate 102 such as n-wells 116 with additional STIs 114. The insulating layer 104 may also include conductive connections 112, which may be used to couple the components of the semiconductor devices and/or integrated circuits within the wafer to external components, other devices, and/or test circuitry.

Depending on the type and configuration of the semiconductor devices and/or integrated circuits within the wafer, the n-wells and p-wells 106, 108, and n-wells 116 with additional STIs 114 may have different shapes and dopant concentrations. The substrate 102 may comprise Silicon, Gallium-Arsenide, Sapphire, or other suitable materials. The substrate 102 may also be doped at a selected concentration of dopants in some examples. The conductive connections 112 may comprise metals such as Aluminum, Nickel, Tungsten, Titanium, Molybdenum, Tantalum, Copper, or similar metals. Some of the conductive connections may be within the insulating layer 104, while other conductive connections may be exposed as connection layers. The insulating layer 104 may be composed of Nitride Oxide, Silicon Oxide, Silicon Nitride, and/or other similar materials.

Embodiments are not limited to the example configuration in diagram 100 and may be implemented with any type of integrated circuit, which may include additional or fewer components of various types.

Semiconductor devices or integrated circuits within a wafer according to embodiments may be fabricated using at least one of the semiconductor fabrication techniques selected from the group of chemical vapor deposition (CVD), low pressure CVD (LPCVD), atmospheric pressure CVD (APCVD), ultrahigh vacuum CVD (UHVCVD), atomic layering deposition (ALD), molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

Figure 2:
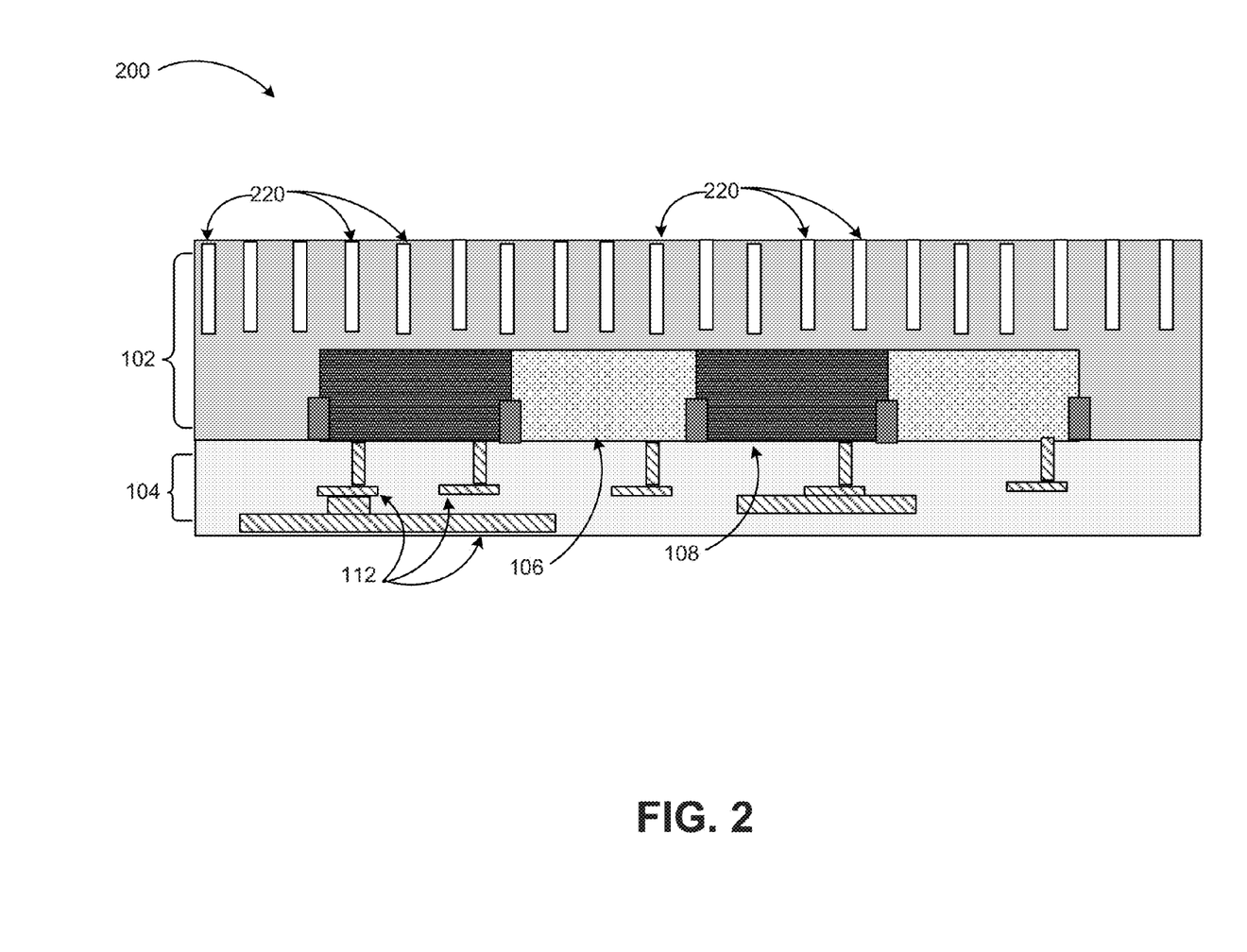
FIG. 2 illustrates a subsequent stage of the example fabrication of a 3D package, where micro-channels are formed in the substrate of the wafer of FIG. 1.

FIG. 2 illustrates a subsequent stage of the example fabrication of a 3D package, where micro-channels are formed in the substrate of the wafer of FIG. 1, arranged in accordance with at least some embodiments described herein.

Diagram 200 includes the wafer with the substrate 102 and the insulating layer 104 with the integrated circuit components in the substrate such as n-wells and p-wells 106, 108, and the conductive connections 112. Some components such as n-wells 116 with additional STIs 114 have been left out for simplicity. Differently, from the wafer of diagram 100, the wafer in diagram 200 includes a plurality of micro-channels 220 spread along the substrate 102.

The micro-channels 220 may be formed at a backside of the wafer (substrate 102) employing a removal process such as reactive ion etching (RIE). For example, the micro-channels 220 may be formed as elongated channels extending from the surface of the substrate 102 into the body of the substrate in a substantially orthogonal direction with respect to the planar surface of the substrate 102. The micro-channels may be formed with various shapes and contours such as cylindrical, polygonal, and similar shapes with various contours. In example embodiments, the micro-channels 220 may have a depth in a range from about 1 µm to about 1 mm and a cross section (e.g., diameter) in a range from about 1 nm to about 1000 µm. The depth may be smaller than the thickness of the wafer or interposer. RIE employs chemically reactive plasma to remove material deposited on wafers. The plasma may be generated under low pressure (vacuum) by an electromagnetic field. High-energy ions from the plasma may attack the wafer surface and react with it. Plasma may be initiated in the system by applying a strong radio frequency (RF) electromagnetic field to the wafer platter. The oscillating electric field may ionize the gas molecules by stripping them of electrons, creating a plasma. In each cycle of the field, the electrons may be electrically accelerated up and down in the chamber, sometimes striking both the upper wall of the chamber and the wafer platter. At the same time, the relatively more massive ions may move relatively little in response to the RF electric field.

When electrons are absorbed into the chamber walls, they may be fed out to ground and not alter the electronic state of the system. However, electrons stripped from the wafer platter may cause the platter to build up charge due to its DC isolation. This charge build up may develop a large negative voltage (e.g., 100–300 V) on the platter. The plasma itself may develop a slightly positive charge due to the higher concentration of positive ions compared to free electrons. Because of the large voltage difference, the positive ions may drift toward the wafer platter, where they collide with the samples to be etched. The ions may react chemically with the materials on the surface of the samples, also sputtering some material by transferring some of their kinetic energy. Due to the mostly vertical delivery of reactive ions, reactive-ion etching may produce very anisotropic etch profiles, which contrast with the typically isotropic profiles of wet chemical etching. Thus, narrow and deep micro-channels in close proximity to each other may be formed in the substrate 102 providing heat dissipation mechanism for the 3D integrated semiconductor device. Etch conditions in an RIE system may depend on process parameters, such as pressure, gas flows, and RF power.

Embodiments are not limited to the techniques such as RIE discussed herein. Other semiconductor fabrication techniques may also be employed to form the structures discussed herein.

Figure 3:
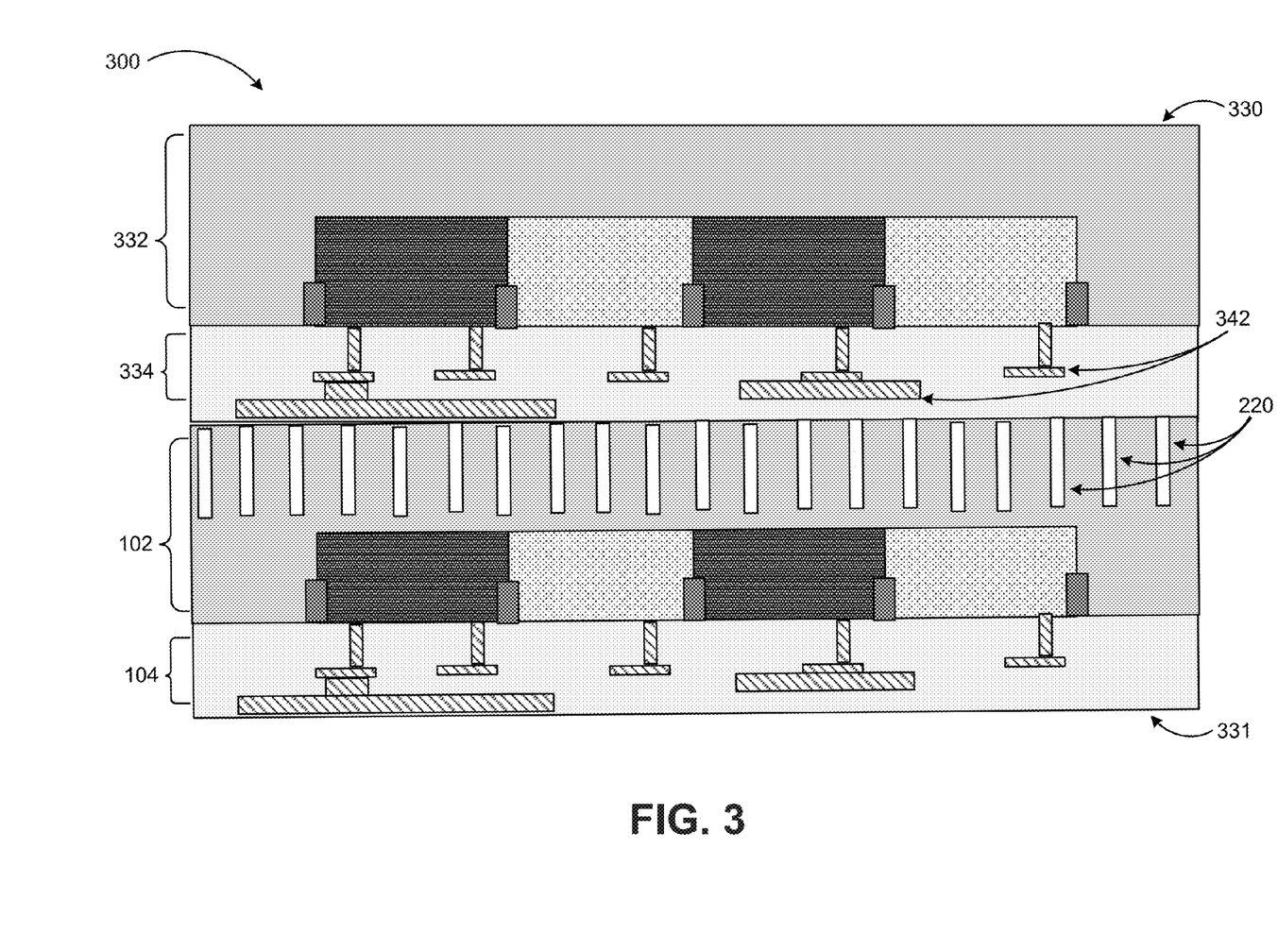
FIG. 3 illustrates another stage of the example fabrication of the 3D package, where a second wafer is placed (and bonded) to a backside of the wafer of FIG. 2.

FIG. 3 illustrates another stage of the example fabrication of the 3D package, where a second wafer is placed (and bonded) to a backside of the wafer of FIG. 2, arranged in accordance with at least some embodiments described herein.

Diagram 300 shows two wafers bonded together for 3D integration. A second wafer 331 may be the same wafer as in FIG. 2 with micro-channels 220 in its substrate 102. A first wafer 330 is shown with substantially similar components as the second wafer 331, but need not be in similar configuration. Indeed, in many implementations, individual wafers of the 3D package may have different component configurations.

The individual components such as the n-wells or p-wells are shown for illustrative purposes only. In the example configuration, the wafers are paced such that the insulating layer 334 of the first wafer 330 is in contact with the substrate 102 of the second wafer 331. Thus, conductive connections 342 of the first wafer 330 are in close proximity of the micro channels 220. The substrate 332 of the first wafer 330 does not have micro-channels, but in multi-layer vertical integrations, micro-channels for heat dissipation may be formed in each (or some of the layers.

A 3D integrated circuit (3D IC) is a single integrated circuit built by stacking silicon wafers and/or dies and interconnecting them vertically so that they behave as a single device. By using TSV technology, 3D ICs may be able to support relatively large amount of functionality in a relatively small form factor. The different devices in the stack may be heterogeneous, e.g. combining CMOS logic, DRAM and III-V materials into a single IC. In addition, critical electrical paths through the device may be substantially shortened, enabling faster operations.

Figure 4:
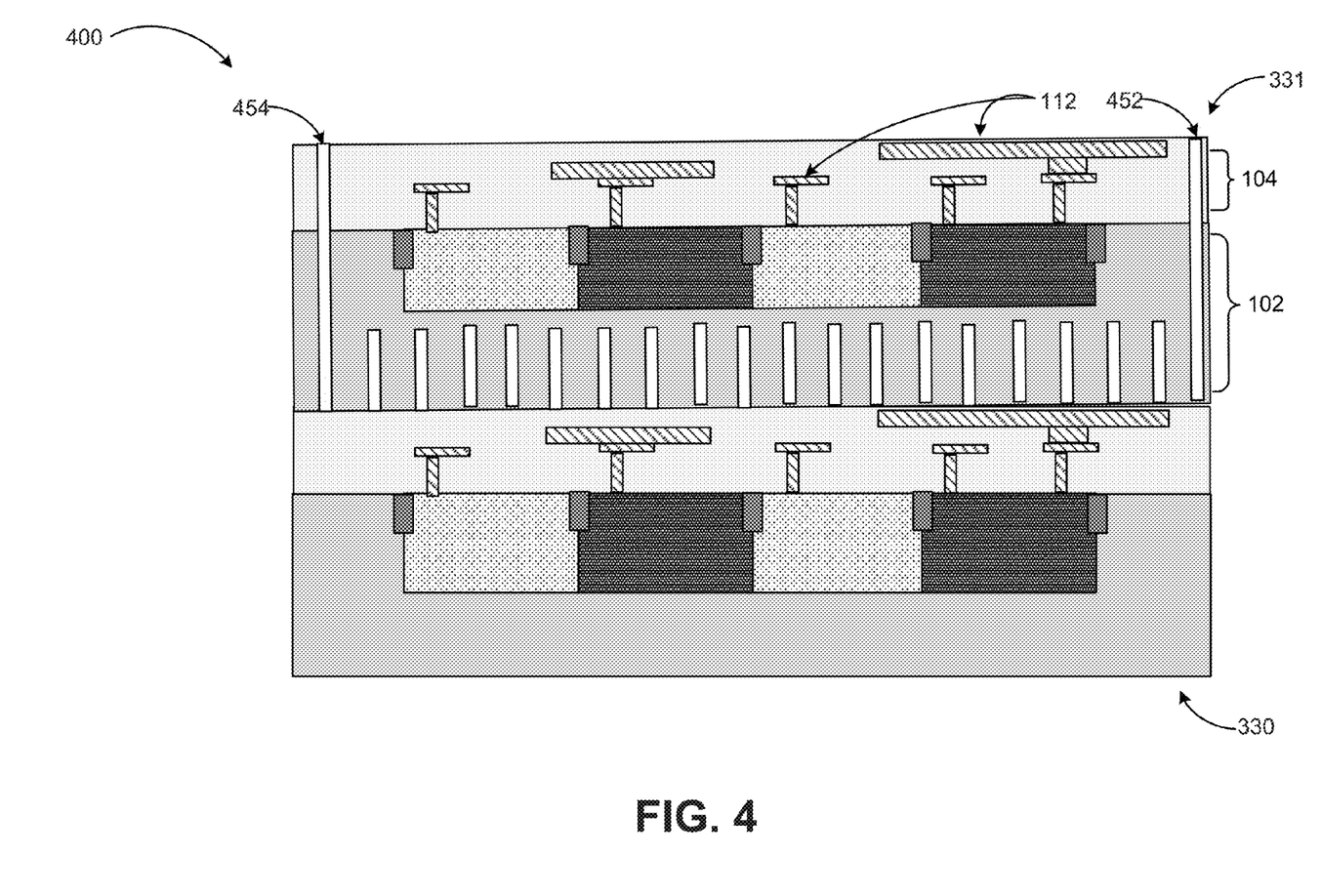
FIG. 4 illustrates the example bonded wafers of FIG. 3, where selected micro-channels are converted to TSVs by a second etching process.

FIG. 4 illustrates the example bonded wafers of FIG. 3, where selected micro-channels are converted to TSVs by a second etching process, arranged in accordance with at least some embodiments described herein.

Diagram 400 shows the two-wafer example integrated device of FIG. 3 with two example TSVs formed using two already formed micro-channels. In the second wafer 331 of diagram 400, the outer most micro-channels are converted to TSVs 452 and 454 by a second removal (e.g., RIE) process.

Through silicon via (TSV) is a vertical electrical connection passing completely through a silicon wafer or die. TSVs may enable high performance operation for 3D integrated circuits, compared to alternatives such as package-on-package, because the density of the vias may be substantially higher, and because the length of the connections may be shorter.

The TSVs 452 and 454 may be formed through the front side of the first wafer 331 (the insulating layer 104). Because the micro-channels 220 already exist, by selecting the location of one or more micro-channels for the TSVs, the TSVs may be formed partially together with the micro-channel enabling faster and more cost-effective fabrication processes. The TSVs may subsequently be filled with conductive material such as Aluminum, Nickel, Tungsten, Titanium, Molybdenum, Tantalum, Copper, or similar metals.

Figure 5:
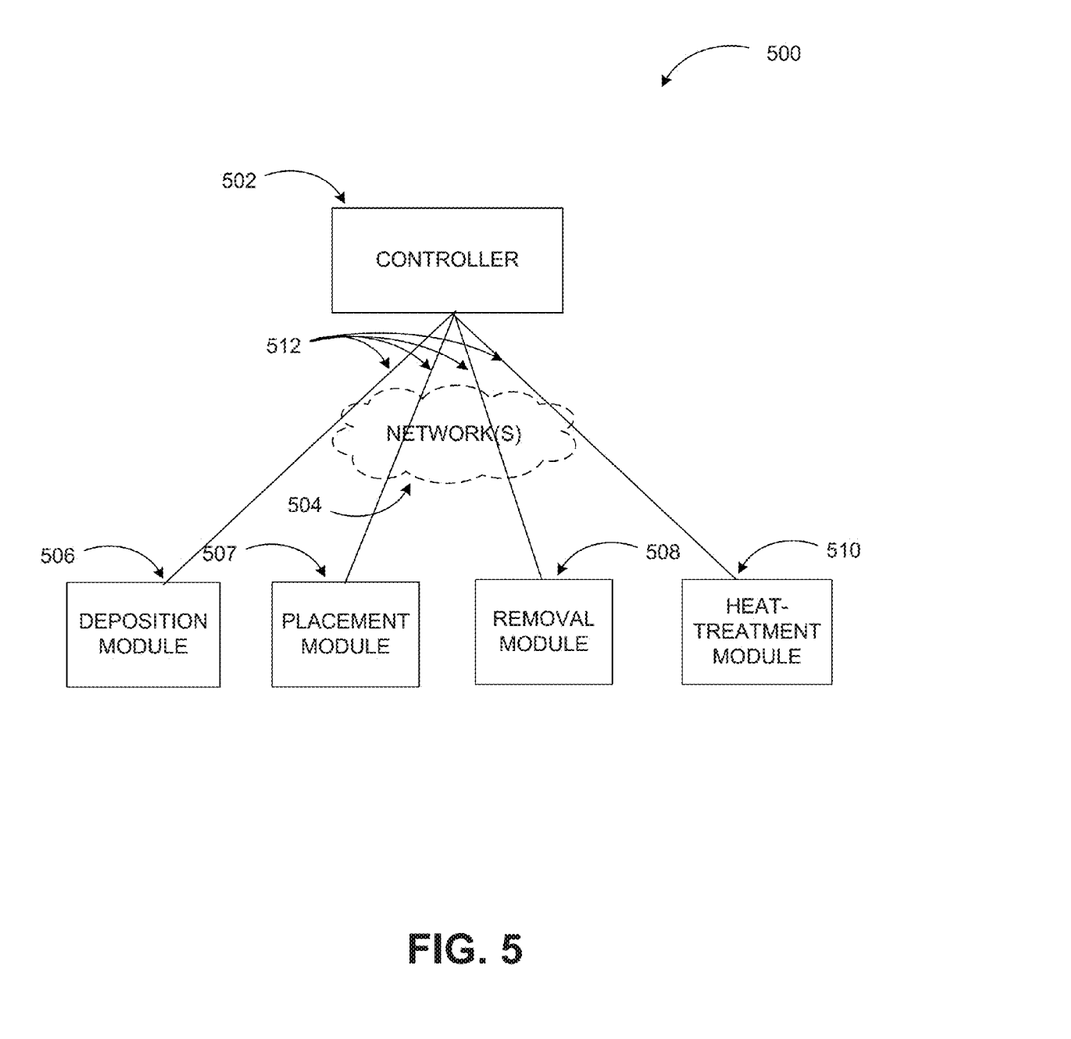
FIG. 5 illustrates an example fabrication system for vertically integrating wafers with backside TSVs and micro-channels for heat mitigation.

FIG. 5 illustrates an example fabrication system for vertically integrating wafers with backside TSVs and micro-channels for heat mitigation, arranged in accordance with at least some embodiments described herein.

Diagram 500 includes an example fabrication system with a controller 502, deposition module 506, placement module 507, removal module 508, and heat-treatment module 510. In some embodiments, the controller 902 may be directly coupled to the deposition module 506, placement module 507, the removal module 508, and the heat-treatment module 510 in an integrated fabrication system. In other embodiments, the controller 502 may be a remotely located controller that is communicatively coupled to the deposition module 506, placement module 507, the removal module 508, and the heat-treatment module 510. In still other examples, one or more network(s) 504, either wired or wireless, may be configured to provide communicative coupling between the controller 502 and the deposition module 506, the removal module 508, and the heat-treatment module 510.

The controller 502 may be configured to coordinate operations of one or more of the deposition module 506, placement module 507, the removal module 508, and the heat-treatment module 510, as well as other optional modules (not shown) such as a scribing module, a doping module, and similar ones. In some examples, the controller 502 may coordinate the operation of the various modules via operation of one or more control signals 512. The various control signals 512 may be of a digital format or an analog format, as may be required to interface with the corresponding module. Each signal may be generated (e.g., asserted, de-asserted, pulsed, transmitted/received, communicated, etc.) in response to operation of instructions, in some examples.

The controller 502 may correspond to a software controller, a hardware controller, or a combination thereof. Example controllers may include one or more computers, general purpose processors, special purpose processors, circuits, application specific integrated circuits (ASICs) or combinations thereof. Example processors may include micro-processors, micro-controllers, complex instruction set computer (CISCs) processors, reduced instruction set computer (RISC), or other similar variations thereof. The operation of some controller implementations may include execution of hardware based instructions such as from firmware, software based instructions, or combinations thereof.

The deposition module 506 may be configured (e.g., via one or more control signals 512 from controller 502) to perform various actions such as depositing the insulating layer 104 over the substrate 102, adhesive materials between the wafers to be bonded, etc. by using various material deposition or growth techniques such as chemical vapor deposition (CVD), atomic layering deposition (ALD), sputter deposition, and similar ones.

The placement module 507 may be configured (e.g., via one or more control signals 512 from controller 502) to perform actions such as flipping one of the wafers to be integrated, positioning the wafers to overlap prior to bonding, etc.

The removal module 508 may be configured (e.g., via one or more control signals 512 from controller 502) to perform actions such as removal of portions of the substrate 102 to form the micro-channels and the insulating layer 104 to form the TSVs. The removal module 508 may employ various techniques such as RIE, wet etching, laser etching, and similar ones.

The heat-treatment module 510 may be configured (e.g., via one or more control signals 512) to perform actions such as annealing of the sandwiched wafers.

Embodiments are not limited to the example modules of diagram 500. A system to fabricate a vertically integrated wafers with backside TSVs and micro-channels for heat mitigation may include additional or fewer fabrication modules, and some of the operations may be combined to be performed by the same modules. In yet other examples, the operations, such as deposition operations, may be split among multiple modules.

Figure 6:
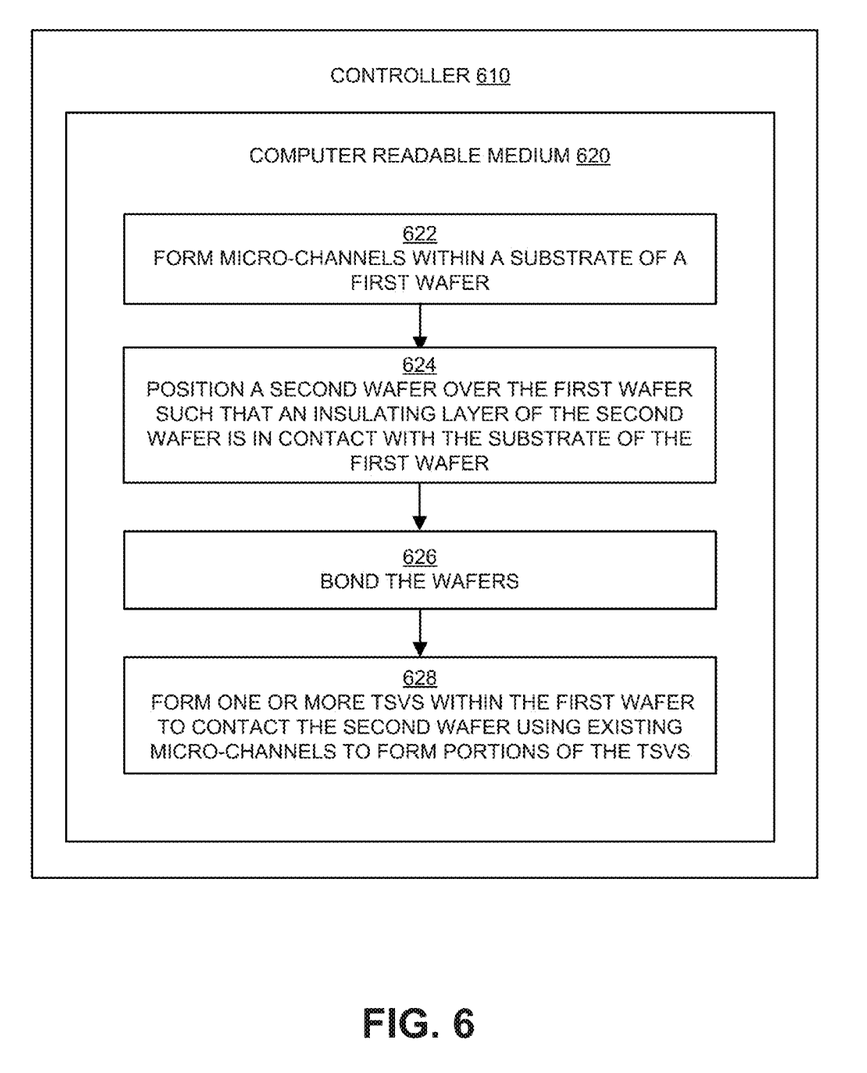
FIG. 6 is a flow diagram illustrating an example method to fabricate a 3D package with backside TSVs and micro-channels for heat mitigation, all arranged in accordance with at least some embodiments described herein.

FIG. 6 is a flow diagram illustrating an example method to fabricate 3D integrated semiconductor devices with backside TSVs and micro-channels for heat mitigation, arranged in accordance with at least some embodiments described herein.

Example methods may include one or more operations, functions or actions as illustrated by one or more of blocks 622 through 630, and may in some embodiments be performed by a controller for a wafer fabrication system. The 3D integrated wafer fabrication system may include a number of modules for various stages of fabrication such as etching, deposition, scribing, etc. Some or all of those modules may be managed by a controller that instructs the respective modules to perform the operations 622 through 630. In some embodiments, the controller may be a computing device such as a desktop computer, a server, a laptop computer, or other forms of computing devices. Thus, the operations described in the blocks 622-630 may also be stored as computer-executable instructions in a non-transitory computer-readable medium, such as a computer-readable medium 620 of a controller 610, and may be executable by one or more processors.

A 3D integrated semiconductor device according to embodiments may be fabricated by the fabrication system using at least one of the semiconductor fabrication techniques selected from the group of chemical vapor deposition (CVD), low pressure CVD (LPCVD), atmospheric pressure CVD (APCVD), ultrahigh vacuum CVD (UHVCVD), atomic layering deposition (ALD), molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

An example process to fabricate vertically integrated semiconductor devices with backside TSVs and micro-Channels for heat mitigation may begin with block 622, "FORM MICRO-CHANNELS WITHIN A SUBSTRATE OF A FIRST WAFER," where micro-channels for heat dissipation may be formed in the substrate of a wafer to be integrated with another wafer. The micro-channels may be distributed evenly throughout the substrate or concentrated under areas, where semiconductor circuitry is expected to generate excessive heat during operation. In other examples micro-channels ma be formed within a substrate of a second wafer and/or within another substrate of a third wafer.

Block 622 may be followed by block 624, "POSITION A SECOND WAFER OVER THE FIRST WAFER SUCH THAT AN INSULATING LAYER OF THE SECOND WAFER IS IN CONTACT WITH THE SUBSTRATE OF THE FIRST WAFER," where the wafer with the micro-channels may be brought together in a back-to-front configuration with a second wafer for integration leaving the micro-channels sandwiched between the wafers. In other examples, a third wafer may be positioned over the second wafer such that the insulating layer of the third wafer is in contact with the substrate of the second water.

Block 624 may be followed by block 626, "BOND THE WAFERS," where the wafers may be bonded together using various bonding techniques such as adhesive bonding (e.g., using polymers as adhesive), direct bonding, plasma activated bonding, eutectic bonding, anodic bonding, glass fit bonding, thermo-compression bonding, reactive bonding, and/or similar techniques. In examples, the second and third wafers may be bonded.

Block 626 may be followed by block 628, "FORM ONE OR MORE TSVs WITHIN THE FIRST WAFER TO CONTACT THE SECOND WAFER USING EXISTING MICRO-CHANNELS TO FORM PORTIONS OF THE TSVs," At block 628, TSVs may be formed in the first wafer (e.g., by laser drilling, etching, etc.) to provide electrical coupling between the wafers through already formed microchannels. The TSVs may be subsequently filled with conductive material such as metals. In other exam one or more TSVs within the second wafer ma contact the third wafer using the existing micro-channels to form portions of the TSVs.

The blocks included in the above described process are for illustration purposes. Fabrication of three-dimensionally integrated ICs may be implemented by similar processes with fewer or additional blocks. In some embodiments, the blocks may be performed in a different order. In some other embodiments, various blocks may be eliminated. In still other embodiments, various blocks may be divided into additional blocks, supplemented with other blocks, or combined together into fewer blocks.

According to some examples, three-dimensionally integrated semiconductor devices may be described. An example three-dimensionally integrated semiconductor device may include a first wafer including a plurality of micro-channels within a substrate of the first wafer and one or more through silicon vias (TSVs) within the substrate and an insulating layer of the first wafer, and a second wafer, where the one or more TSVs are configured to contact the second wafer and at least a portion of the one or more TSVs is configured to overlap with corresponding micro-channels.

According to other examples, the first wafer and the second wafer may be arranged such that the insulating layer of the first wafer is in contact with a substrate of the second wafer. The first wafer and the second wafer may include one or more conductive connections within their respective insulating layers and a portion of the conductive connections are in proximity of a portion of the plurality of micro-channels. The conductive connections may include a metal from a list of Aluminum, Nickel, Copper, Titanium, Molybdenum, Tantalum, or Tungsten. A number and a placement of the micro-channels may be selected based on a size and a distribution of the conductive connections.

According to further examples, the TSVs may be configured to provide electrical coupling between a first set of semiconductor circuitry of the first wafer and a second set of semiconductor circuitry of the second wafer. The three-dimensionally integrated semiconductor device may also include a third wafer including a plurality of micro-channels within a substrate of the third wafer and one or more TSVs of the third wafer located within the substrate and an insulating layer of the third wafer, where the one or more TSVs of the third wafer are configured to contact the second wafer and at least a portion of the one or more TSVs of the third wafer is configured to overlap with corresponding micro-channels. The micro-channels and the TSVs may have a cylindrical, an elliptical, or a polygonal shape.

According to other examples, methods to fabricate a three-dimensionally integrated semiconductor device may be described. An example method may include forming a plurality of micro-channels within a substrate of a first wafer; positioning a second wafer over the first wafer such that an insulating layer of the second wafer is in contact with the substrate of the first wafer; and bonding the first wafer and the second wafer. The example method may also include forming one or more through silicon vias (TSVs) within the substrate and an insulating layer of the first wafer, where the one or more TSVs are configured to contact the second wafer and at least a portion of the one or more TSVs is configured to overlap with corresponding micro-channels.

According to yet other examples, forming the micro-channels within the substrate of the first wafer may include employing a reactive ion etching (RIE) process, forming the micro-channels with a cylindrical shape, an elliptical shape, or a polygonal shape, forming the micro-channels with a depth in a range from about 1 μm to about 1 mm, and/or forming the micro-channels with a cross-sectional diameter in a range from about 1 nm to about 1000 μm.

According to yet further examples, forming the one or more TSVs within the substrate and the insulating layer of the first wafer may include employing a subsequent RIE process to deepen and widen one or more micro-channels, forming the one or more TSVs with a depth in a range from about 10 μm to about 10 mm, and/or forming the one or more TSVs with a cross-sectional diameter in a range from about 10 nm to about 1000 μm.

According to some examples, the method may further include filling the TSVs with a metal from a list of Aluminum, Nickel, Copper, Titanium, Molybdenum, Tantalum, or Tungsten. The method may also include selecting a number and a placement of the micro-channels based on a size and a distribution of conductive connections within an insulating layer of the second wafer or based on an expected heat profile of semiconductor circuitry in the first wafer and the second wafer during operation.

According to other examples, the method may further include forming another plurality of micro-channels within a substrate of the second wafer, positioning a third wafer over the second wafer such that an insulating layer of the third wafer is in contact with the substrate of the second wafer, bonding the second wafer and the third wafer, and/or forming one or more additional TSVs within the substrate and the insulating layer of the second wafer, where the one or more additional TSVs are configured to contact the third wafer and at least a portion of the one or more additional TSVs is configured to overlap with corresponding micro-channels in the second wafer. The method may yet include filling the additional TSVs with a metal from a list of Aluminum, Nickel, Copper, Titanium, Molybdenum, Tantalum, or Tungsten.

According to further examples, a system configured to fabricate a three-dimensionally integrated semiconductor device may be described. An example system may include a removal module configured to form a plurality of micro-channels within a substrate of a first wafer, a placement module configured to position a second wafer over the first wafer such that an insulating layer of the second wafer is in contact with the substrate of the first wafer, and a bonding module configured to bond the first wafer and the second wafer. The system may also include a controller configured to coordinate operations of the removal module, the placement module, and the bonding module. The removal module may be further configured to form one or more through silicon vias (TSVs) within the substrate and an insulating layer of the first wafer such that the one or more TSVs are configured to contact the second wafer and at least a portion of the one or more TSVs is configured to overlap with corresponding micro-channels.

According to yet other examples, the removal module may be configured to form the micro-channels and the TSVs employing one of wet etching, chemical etching, plasma etching, or reactive ion etching (RIE). The removal module may also be configured to form the micro-channels and the TSVs employing two successive RIE processes. The system may further include a deposition module configured to fill the TSVs with a metal from a list of Aluminum, Nickel, Copper, Titanium, Molybdenum, Tantalum, or Tungsten.

According to yet further examples, the controller may be configured to select a number and a placement of the micro-channels based on a size and a distribution of conductive connections within an insulating layer of the second wafer, and to select a number and a placement of the micro-channels based on an expected heat profile of semiconductor circuitry in the first wafer and the second wafer during operation. The controller may be integrated with the removal module, the placement module, the bonding module, and the deposition module. Alternatively, the controller may be communicatively coupled to the removal module, the placement module, the bonding module, and the deposition module over one or more networks.

There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example as one or more programs running on one or more microprocessors), as firmware, or as virtually any combination thereof, and that designing the circuitry and/or writing the code for the software and/or firmware would be possible in light of this disclosure.

The present disclosure is not to be limited in terms of the particular embodiments described in this application, which are intended as illustrations of various aspects. Many modifications and variations can be made without departing from its spirit and scope Functionally equivalent methods and apparatuses within the scope of the disclosure, in addition to those enumerated herein, will be possible from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that particular functionality is achieved. Hence, any two components herein combined to achieve a particular functionality may be seen as "associated with" each other such that the particular functionality is achieved, irrespective of architectures or intermediate components. Likewise, any two components so associated may also be viewed as being "operably connected", or "operably coupled", to each other to achieve the particular functionality, and any two components capable of being so associated may also be viewed as being "operably couplable", to each other to achieve the particular functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A three-dimensionally integrated semiconductor device comprising:
   a first wafer that includes:
      micro-channels distributed within a substrate of the first wafer based on an expected heat profile of semiconductor circuitry in the first wafer and a second wafer, and
      one or more through silicon vias (TSVs) within the substrate and an insulating layer of the first wafer, wherein each of the micro-channels have a vertical depth with respect to a thickness of the first wafer in a range from about 1 μm to about 1 mm; and
   the second wafer, wherein the one or more TSVs are configured to contact the second wafer and at least a portion of the one or more TSVs is configured to overlap with corresponding micro-channels.

2. The semiconductor device of claim 1, wherein the first wafer and the second wafer are arranged such that the insulating layer of the first wafer is in contact with a substrate of the second wafer.

3. The semiconductor device of claim 1, wherein the first wafer and the second wafer include one or more conductive connections within their respective insulating layers and a portion of the conductive connections are in proximity of a portion of the micro-channels.

4. The semiconductor device of claim 3, wherein the conductive connections include a metal, and wherein the metal includes Aluminum, Nickel, Copper, Titanium, Molybdenum, Tantalum, of Tungsten.

5. The semiconductor device of claim 1, wherein the distribution of the micro-channels is selected further based on a distribution of the conductive connections.

6. The semiconductor device of claim 1, wherein the one or more TSVs are configured to provide electrical coupling between a first set of semiconductor circuitry of the first wafer and a second set of semiconductor circuitry of the second wafer.

7. The semiconductor device of claim 1, further comprising:
   a third wafer that includes micro-channels within a substrate of the third wafer and one or more TSVs of the third wafer located within the substrate and an insulating layer of the third wafer, wherein the one or more TSVs of the third wafer are configured to contact the second wafer and at least a portion of the one or more TSVs of the third wafer is configured to overlap with corresponding micro-channels.

8. The semiconductor device of claim 1, wherein each of the one or more TSVs have one of the cylindrical shape, the elliptical shape, and the polygonal shape.

9. The semiconductor device of claim 1, wherein the micro-channels each have a cross-sectional diameter in a range from about 1 nm to about 1000 μm.

10. The semiconductor device of claim 1, wherein the one or more TSVs have a depth in a range from about 10 μm to about 10 mm.

11. The semiconductor device of claim 1, wherein the one or more TSV's have a cross-sectional diameter in a range from about 10 nm to about 1000 μm.

12. A three-dimensionally integrated semiconductor device comprising:
   a first wafer that includes:
      micro-channels distributed within a substrate of the first wafer based on an expected heat profile of semiconductor circuitry in the first wafer and a second wafer, and
      one or more through silicon vias (TSVs) within the substrate and an insulating layer of the first wafer, wherein each of the micro-channels have a vertical depth with respect to a thickness of the first wafer in a range from about 1 μm to about 1 mm; and
   the second wafer, wherein
      the one or more TSVs are configured to contact the second wafer and at least a portion of the one or more TSVs is configured to overlap with corresponding micro-channels, and
      the first wafer and the second wafer are arranged such that the insulating layer of the first wafer is in contact with a substrate of the second wafer.

13. The semiconductor device of claim 12, wherein the insulating layer includes one or more conductive connections effective to couple integrated circuits within the first wafer and the second wafer to one or more of external components, other devices, and test circuitry.

14. A three-dimensionally integrated semiconductor device comprising:
   a first wafer that includes:
      micro-channels distributed within a substrate of the first wafer based on an expected heat profile of semiconductor circuitry in the first wafer and a second wafer,
      an insulating layer, and
      one or more through silicon vias (TSVs) within the substrate and the insulating layer of the first wafer, wherein each of the micro-Channels have a vertical depth with respect to a thickness of the first wafer in a range from about 1 μm to about 1 mm; and
   the second wafer, wherein
      the one or more TSVs are configured to contact the second wafer and at least a portion of the one or more TSVs is configured to overlap with corresponding micro-channels,
      the first wafer and the second wafer include one or more conductive connections within the insulating layer of the first wafer and the insulating layer of the second wafer, and
      a portion of the one or more conductive connections are in proximity of a portion of the micro-channels.

15. The semiconductor device of claim 14, wherein the micro-channels are formed as elongated channels that extend from a surface of the substrate of the first wafer into a body of the substrate of the first wafer in a substantially orthogonal direction with respect to a planar surface of the substrate of the first wafer.

* * * * *